United States Patent
Song et al.

(10) Patent No.: US 9,691,830 B2
(45) Date of Patent: Jun. 27, 2017

(54) ORGANIC ELECTROLUMINESCENT DISPLAY PANEL, ITS MANUFACTURING METHOD AND DISPLAY DEVICE

(71) Applicant: BOE Technology Group Co., Ltd., Beijing (CN)

(72) Inventors: Yingying Song, Beijing (CN); Hsiao Wen Hung, Beijing (CN); Hao Chih Hung, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/768,993

(22) PCT Filed: Nov. 5, 2014

(86) PCT No.: PCT/CN2014/090290
§ 371 (c)(1),
(2) Date: Aug. 19, 2015

(87) PCT Pub. No.: WO2016/019643
PCT Pub. Date: Feb. 11, 2016

(65) Prior Publication Data
US 2016/0247862 A1    Aug. 25, 2016

(30) Foreign Application Priority Data

Aug. 8, 2014   (CN) .......................... 2014 1 0389844

(51) Int. Cl.
*H01L 27/32* (2006.01)
*H01L 51/50* (2006.01)
*H01L 51/00* (2006.01)

(52) U.S. Cl.
CPC ...... *H01L 27/3246* (2013.01); *H01L 51/0005* (2013.01); *H01L 51/0012* (2013.01); *H01L 51/5012* (2013.01); *H01L 2227/323* (2013.01)

(58) Field of Classification Search
CPC .................................................. H01L 27/3246
See application file for complete search history.

(56) References Cited

U.S. PATENT DOCUMENTS

| 2014/0329056 A1* | 11/2014 | Hou | H01L 51/56 428/195.1 |
| 2015/0137090 A1* | 5/2015 | Lee | H01L 27/326 257/40 |
| 2015/0194629 A1* | 7/2015 | Liu | H01L 51/56 257/40 |

FOREIGN PATENT DOCUMENTS

| CN | 1622706 A | 6/2005 |
| CN | 101243553 A | 8/2008 |

(Continued)

OTHER PUBLICATIONS

May 4, 2015—International Search Report Appn PCT/CN2014/090290 with Eng Tran of Written Opinion.

(Continued)

*Primary Examiner* — Joseph L Williams
(74) *Attorney, Agent, or Firm* — Banner & Witcoff, Ltd.

(57) ABSTRACT

An organic electroluminescent display panel, its manufacturing method and a display device are disclosed. In the organic electroluminescent display panel, a pixel definition layer provided therein has opening regions corresponding to pixel areas in the OLED, and each of the opening regions has an opening larger than a bottom surface of the opening region (300). An upper surface (a) of the pixel definition layer is formed from a hydrophobic material, and an inclination surface (b) of the pixel definition layer corresponding to each of the opening regions is formed from a hydrophilic material. The above OLED can assure the uniformity of the film layers formed after the pixel definition layer can be guaranteed to improve the light emitting performance of the OLED.

20 Claims, 5 Drawing Sheets

(56) References Cited

FOREIGN PATENT DOCUMENTS

| | | |
|---|---|---|
| CN | 101399283 A | 4/2009 |
| CN | 102386206 A | 3/2012 |
| CN | 102705790 A | 10/2012 |
| CN | 203205422 U | 9/2013 |
| CN | 103413819 A | 11/2013 |
| CN | 103839964 A | 6/2014 |
| JP | 2007073284 A | 3/2007 |
| JP | 2008-243406 A | 10/2008 |

OTHER PUBLICATIONS

Jun. 24, 2016—(CN)—First Office Action Appn 201410389844.X with English Tran.
Dec. 14, 2016—(CN) Second Office Action Appn 201410389844.X with English Tran.

* cited by examiner

ORGANIC ELECTROLUMINESCENT DISPLAY PANEL, ITS MANUFACTURING METHOD AND DISPLAY DEVICE

The application is a U.S. National Phase Entry of International Application No. PCT/CN2014/090290 filed on Nov. 5, 2014, designating the United States of America and claiming priority to Chinese Patent Application No. 201410389844.X filed on Aug. 8, 2014. The present application claims priority to and the benefit of the above-identified applications and the above-identified applications are incorporated by reference herein in their entirety.

TECHNICAL FIELD

At least one embodiment of the present invention relates to an organic electroluminescent display panel, its manufacturing method and a display device.

BACKGROUND

Currently, organic electroluminescent display (OLED) panels are becoming dominant in the display field due to characteristics such as low power consumption, high color saturation, wide angle of view, slim thickness, no requirement for light source, flexible, and so on.

The basic structure of an OLED includes a base substrate, and an anode, a light emitting layer and a cathode subsequently provided on the base substrate. Its principle for emitting light is that, when a voltage is applied across the anode and the cathode to provide a current, electrons from the cathode are recombined with holes from the anode at the light emitting layer to form excitons, so that the organic material in the light emitting layer is excited to emit light. The light emitting layer can be made by an inkjet printing technology, and generally, before preparing the light emitting layer, a pixel definition layer can be made on the base substrate on which the anode has been formed, to define the position for the pixel area, after that, the light emitting layer is formed in an opening region corresponding to the pixel area in the pixel definition layer, and finally, a film layer for the cathode is made on the light emitting layer

SUMMARY

At least one embodiment of the present invention provides an organic electroluminescent display panel, its manufacturing method and a display device, by which the film layer formed after the pixel definition layer has good uniformity, and thus the light emitting performance of the OLED is improved.

At least one embodiment of the present invention provides an organic electroluminescent display panel comprising a base substrate and a pixel definition layer located on the base substrate; the pixel definition layer has opening regions corresponding to pixel areas of the organic electroluminescent display panel, and each of the opening regions has an opening larger than a bottom surface of the opening region; the pixel definition layer has a upper surface formed from a hydrophobic material, and an inclination surface of the pixel definition layer corresponding to each of the opening regions is formed from a hydrophilic material.

At least one embodiment of the present invention further provides a manufacturing method for the organic electroluminescent display panel provided by the above embodiment of the present invention, the manufacturing method includes forming a pixel definition layer on a base substrate so that the pixel definition layer has opening regions corresponding to pixel areas in the organic electroluminescent display panel, wherein each of the opening regions has an opening larger than a bottom surface of the opening region, the pixel definition layer has an upper surface formed from a hydrophobic material, and an inclination surface of the pixel definition layer corresponding to each of the opening regions is formed from a hydrophilic material.

At least one embodiment of the present invention further provides a display device including the organic electroluminescent display panel provided by the embodiments of the present invention.

DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to prepare objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Figure 1A:
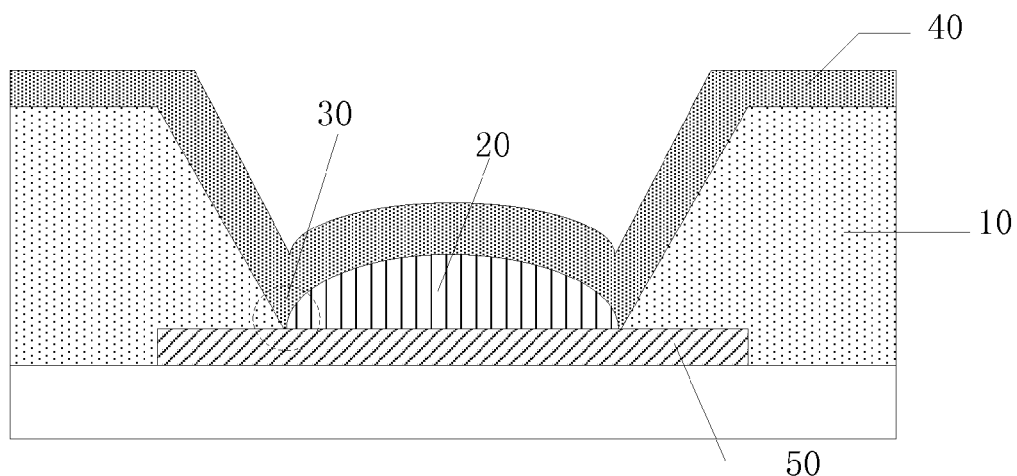
FIG. 1a and FIG. 1b are schematic structure views showing the organic electroluminescent display panel having a pixel definition layer, respectively.
Figure 1B:
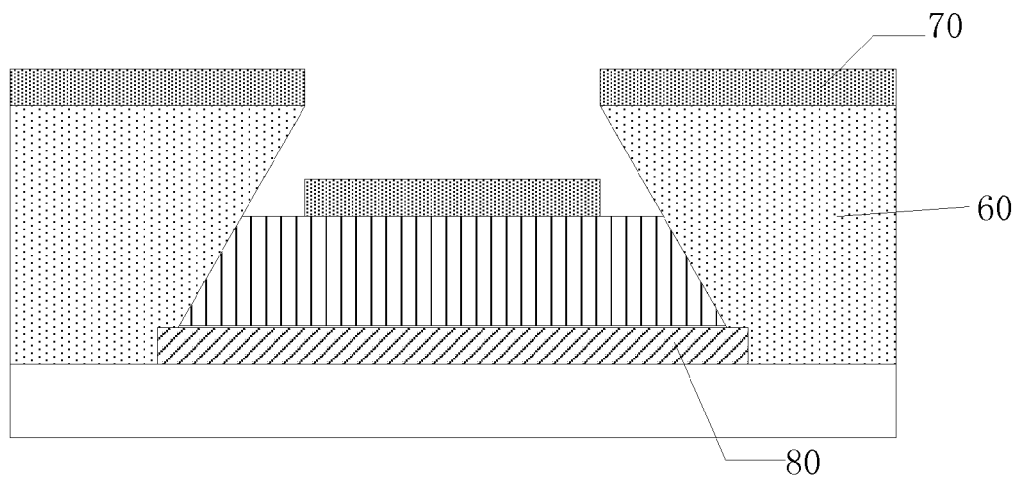

Currently, the pixel definition layer in an OLED has mainly two kinds of structures. One structure involves a pixel definition layer having a regular trapezoidal cross-section with an upper bottom side being smaller than a lower bottom side, as shown in FIG. 1a (only partly shown in FIG. 1a). Generally, after the pixel definition layer 10 has a regular trapezoidal cross-section is made, in order to avoid color blending between adjacent pixel areas, it is necessary to subject the surface of the pixel definition layer to hydrophobic treatment to have hydrophobic property. In this way, although the color blending problem can be avoided, the inventors of the present application have noted that, there may be unevenly spreading problem when preparing the light emitting layer 20 in the opening regions of the pixel definition layer subsequently, resulting in minute gaps in the light emitting layer 20, thus short circuit at the minute gaps would be easily incurred between the subsequently formed cathode 40 and the anode 50 located below the light emitting layer. Another structure involves a pixel definition layer having an inverted trapezoidal cross-section with an upper bottom side being larger than a lower bottom side, as shown in FIG. 1b (only partly shown in FIG. 1b). Although the pixel definition layer 60 in an inverted trapezoidal shape can avoid short circuit between the cathode 70 and the anode 80, the inventors of the present application have noted that the pixel definition layer 60 in an inverted trapezoidal shape causes the subsequently formed cathode 70 to be broken easily.

Therefore, the above structures of the pixel definition layer will influence the uniformity of the film layer formed subsequently, and thus influence the light emitting performance of the OLED.

Hereinafter, the specific embodiments of the organic electroluminescent display panel, its manufacturing method and the display device provided by the examples of the present invention will be described in detail, in connection with the attached drawings.

The thickness and shape of the film layers in the attached drawings are not intended to reflect the real scale of the organic electroluminescent display panel, and are used to schematically illustrate the content of the embodiments of the present invention.

Figure 2A:
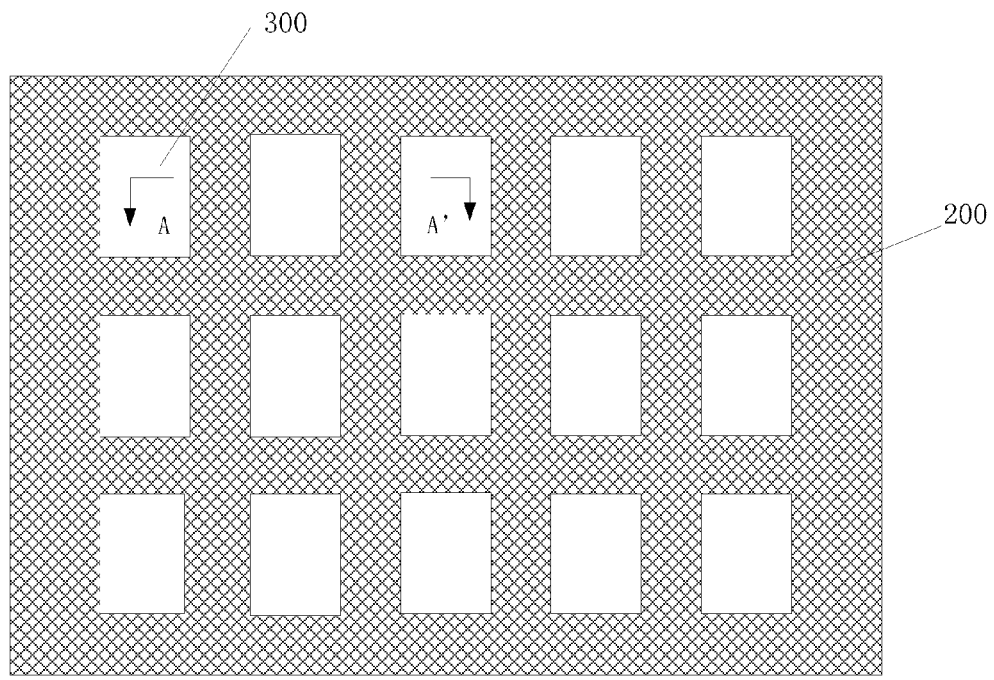
FIG. 2a is a top view showing the organic electroluminescent display panel provided by an embodiment of the present invention.
Figure 2B:
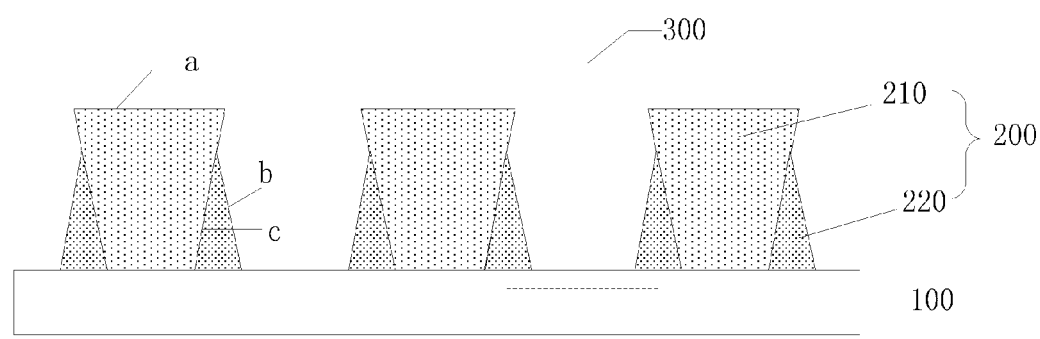
FIG. 2b is a schematic cross-sectional view of FIG. 2a taken along a direction A-A'.

At least one embodiment of the present invention provides an organic electroluminescent display panel, as shown in FIG. 2a and FIG. 2b, the organic electroluminescent display panel includes a base substrate 100 and a pixel definition layer 200 located on the base substrate 100. The pixel definition layer 200 includes opening regions 300 corresponding to pixel areas of the organic electroluminescent display panel, and the opening of each of the opening regions 300 is larger than the bottom surface of the opening region. For example, for each of the opening regions 300, the opening in its cross-section perpendicular to the base substrate is larger than its bottom side, and the width of the cross-section is firstly increased and then decreased from the opening to the bottom side, can be considered as an inverted trapezoidal structure, that is, the cross-section of the pixel definition layer 200 perpendicular to the base substrate 100 has an upper bottom side smaller than a lower bottom side, and the width of the cross-section is firstly decreased and then increased from the upper bottom side to the lower bottom side, and can be considered as a regular trapezoidal structure. Alternatively, for example, the opening of the opening region 300 in the cross-section perpendicular to the base substrate is larger than its bottom side, and the cross-section is gradually decreased from the opening to the bottom side, is in an inverted trapazoidal structure, that is, the cross-section of the pixel definition layer 200 perpendicular to the base substrate 100 has an upper bottom side smaller than a lower bottom side, and the width of the cross-section is gradually increased from the upper bottom side to the lower bottom side, and is in a regular trapezoidal structure. An upper surface a of the pixel definition layer 200 is formed from a hydrophobic material, and an inclination surface b of the pixel definition layer 200 corresponding to the opening region 300 is formed from a hydrophilic material.

In the above organic electroluminescent display panel provided by an embodiment of the present invention, the pixel definition layer provided therein has opening regions corresponding to pixel areas of the organic electroluminescent display panel, and for each of the opening region, the opening is larger than the bottom surface thereof, thus, the breakage problem occurred in the subsequently formed pattern of the cathode can be avoided. By using the hydrophobic material in the upper surface of the pixel definition layer, the subsequently coated light emitting material will not easily residued on the upper surface of the pixel definition layer, and therefore, the color blending problem between the adjacent pixel areas can be avoided. Meantime, by using a hydrophilic material in the inclination surface of the pixel definition layer corresponding to the opening regions, it can be guaranteed that the subsequently coated light emitting material can be uniformly filled into the opening regions, minute gaps occurred due to unevenly spreading of the light emitting material can be avoided, and thus the short circuit problem between the anode and the cathode can be avoided, and therefore the above organic electroluminescent display panel provided by the embodiment of the present invention can guarantee the uniformity of the film layers formed after the pixel definition layer, and the light emitting performance of the organic electroluminescent display panel can be improved.

In practice, in the organic electroluminescent display panel provided by an embodiment of the present invention, in order enable the pixel definition layer 200 to have the upper surface "a" that is formed from a hydrophobic material and the inclination surface "b" corresponding to the opening regions formed from a hydrophilic material, as shown in FIG. 2b, in one embodiment, the structure of the pixel definition layer 200 may include a first pixel definition layer structure 210 formed by the hydrophobic material, and a second pixel definition layer structure 220 formed by the hydrophilic material, and a side surface of the second pixel definition layer structure is adhered to a side surface of the first pixel definition layer structure. Thus, the pixel definition layer 200 formed by the first pixel definition layer structure 210 and the second pixel definition layer structure 220 can have the hydrophobic characteristic on the upper surface "a," by which the subsequently coated light emitting material cannot be easily left on the upper surface "a," and the color blending problem between the adjacent pixel areas can be avoided. Meantime, the inclination surface "b" of the pixel definition layer 200 has a hydrophilic characteristic, by which it is guaranteed that the subsequently coated light emitting material can be evenly filled in the opening regions 300, and the minute gaps occurred due to unevenly spreading of the light emitting material cannot be caused.

In practice, in at least one example of the above organic electroluminescent display panel provided by the embodiment of the present invention, the first pixel definition layer structure 210 may adopt an inverted trapezoidal structure in cross-section perpendicular to the base substrate 100; in at least one example, the second pixel definition layer structure 220 may adopt a triangular structure in cross-section perpendicular to the base substrate 100. When preparing the pixel definition layer 200, in at least one embodiment, the material for the first pixel definition layer structure 210 may employ a hydrophobic material with negative photoresist characteristics, so as to prepare the first pixel definition layer structure 210 having the cross-section in an inverted trapezoidal structure. Because the material with negative photoresist characteristics will form a material insoluble in developing liquid after exposure while the unexposed material will be soluble in the developing liquid, a pattern of the first pixel definition layer structure can be formed. Also because as the thickness of the negative photoresist is increased, the closer the photoresist material approaches the base substrate, the less the light intensity received by the photoresist material. In at least one embodiment, the material for the second pixel definition structure 220 can employ a hydrophilic material with positive photoresist characteristics, to prepare the second pixel definition layer structure 220 having the cross-section in a triangular structure. The positive photoresist material is insoluble in the developing liquid by itself, after being irradiated, forms a material soluble in the developing liquid, and thus the structure having the cross-section in a triangular structure can be easily formed.

In practice, in the above organic electroluminescent display panel provided by the embodiment of the present invention, in order to prevent the second pixel definition layer structure made from the hydrophilic material from influencing the hydrophobic characteristics of the upper surface of the pixel definition layer, in at least one example, the height of the second pixel definition layer structure in the cross-section perpendicular to the base substrate is set to be lower than the height of the first pixel definition layer structure in the cross-section perpendicular to the base substrate. In at least one example, the height of the first pixel definition layer structure in the cross-section perpendicular to the base substrate can be controlled to be from 0.1 μm to 100 μm, for example, the height of the first pixel definition layer structure in its cross-section perpendicular to the base substrate is controlled to be from 0.5 μm to 5 μm, if the height of the second pixel definition layer structure in the cross-section perpendicular to the base substrate is lower than the height of the first pixel definition layer structure in the cross-section perpendicular to the base substrate, the cross-section of the pixel definition layer perpendicular to the base substrate is in a structure like a regular trapezoidal. If the height of the second pixel definition layer structure in the cross-section perpendicular to the base substrate is equal to the height of the first pixel definition layer structure in the cross-section perpendicular to the base substrate, the cross-section of the pixel definition layer perpendicular to the base substrate is in a regular trapezoidal structure. Accordingly, if the cross-section of the pixel definition layer perpendicular to the base substrate is in a structure like a regular trapezoidal, the opening regions have a structure like an inverted trapezoidal in the cross-section perpendicular to the base substrate; and if the cross-section of the pixel definition layer perpendicular to the base substrate is in a regular trapezoidal structure, the opening regions have an inverted trapezoidal structure in the cross-section perpendicular to the base substrate.

In practice, the organic electroluminescent display panel provided by the embodiment of the present invention will usually include film layer structures, such as a light emitting layer, a cathode, an anode, and so on, and other structures such as thin film transistors, gate lines, data lines, or the like will generally also be formed on the base substrate, and these structures can be embodied by many methods, and will not be limited.

Base on the same invention concept, at least one embodiment of the present invention further provides a manufacturing method for the above organic electroluminescent display panel provided by any embodiment of the present invention, the manufacturing method includes forming a pixel definition layer on a base substrate so that the pixel definition layer has opening regions corresponding to pixel areas in the organic electroluminescent display panel, each of the opening regions has an opening larger than the bottom surface of the opening region, the upper surface of the pixel definition layer is formed from a hydrophobic material, and the inclination surface of the pixel definition layer corresponding to the opening region is formed from a hydrophilic material. Because the principle of the present method for solving the problem in the known technology is similar to that in the organic electroluminescent display panel as described above, the implementation of the method can refer to the implementation of the above organic electroluminescent display panel, and repetitions will be omitted here.

Figure 3:
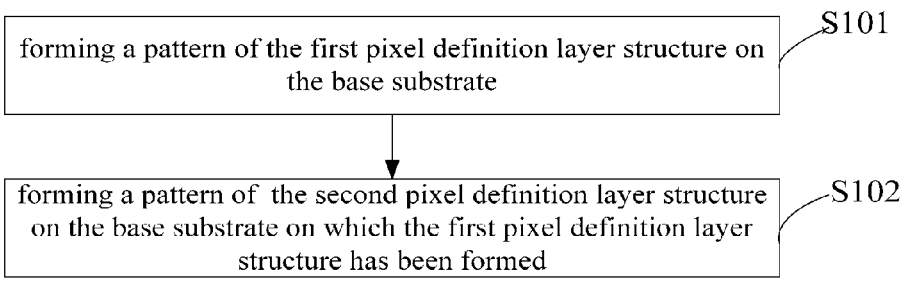
FIG. 3 is a flowchart view showing a manufacturing method for the organic electroluminescent display panel, provided by an embodiment of the present invention.

In practice, as shown in FIG. 3, the manufacturing method for the organic electroluminescent display panel provided by the embodiment of the present invention, for example, may include the steps of:

S101, forming a pattern of the first pixel definition layer structure on the base substrate; and S102, forming a pattern of the second pixel definition layer structure on the base substrate on which the first pixel definition layer structure has been formed.

In practice, in the manufacturing method for the above organic electroluminescent display panel provided by the embodiment of the present invention, the step S101 of forming a pattern of the first pixel definition layer structure on the base substrate, for example, may be achieved by firstly depositing a layer of a hydrophobic material with negative photoresist characteristics on the base substrate, and then subjecting the hydrophobic material with the negative photoresist characteristics to a patterning process by using a first mask plate to form the pattern of the first pixel definition layer structure.

In practice, because the first pixel definition structure is formed from the a hydrophobic material with negative photoresist characteristics, the first pixel definition layer structure can have its cross-section perpendicular to the base substrate to be of an inverted trapezoidal structure.

In practice, in the manufacturing method for the above organic electroluminescent display panel provided by the embodiment of the present invention, the step S102 of forming the pattern of the second pixel definition layer structure on the base substrate on which the first pixel definition layer structure has been formed, for example, can be achieved by firstly depositing a layer of a hydrophilic material with positive photoresist characteristics on the base substrate on which the first pixel definition layer structure has been formed, and then subjecting the hydrophilic material with positive photoresist characteristics to a patterning process by using the pattern of the first pixel definition layer structure as a mask plate, to form the pattern of the second pixel definition layer structure.

In practice, because the material of the second pixel definition layer structure employs the hydrophilic material with positive photoresist characteristics, the second pixel definition layer structure can have its cross-section perpendicular to the base substrate to be a triangular structure.

In practice, only one mask plate can be used during the manufacturing process of the first pixel definition layer structure and the second pixel definition layer structure (that is, the same mask plate is used when preparing the first pixel definition layer structure and the second pixel definition layer structure), and thus the number of the mask plate will not be increased compared with the manufacturing process for a pixel definition layer in single layer structure. Furthermore, because the materials respectively for forming the second pixel definition layer structure and the first pixel definition layer structure have opposite photosensitive characteristics, the pattern of the first pixel definition layer structure which is formerly formed can also be used as a mask plate during the manufacturing process of the second pixel definition layer structure, whereby the error occurred in alignment of the mask plate with the base substrate can be avoided, which otherwise would influence the accuracy for forming the patterns.

Hereinafter, with reference to two specific embodiments, the manufacturing method for the organic electroluminescent display panel provided by the embodiment of the present invention will be described in detail.

FIRST EXAMPLE

Figure 4:
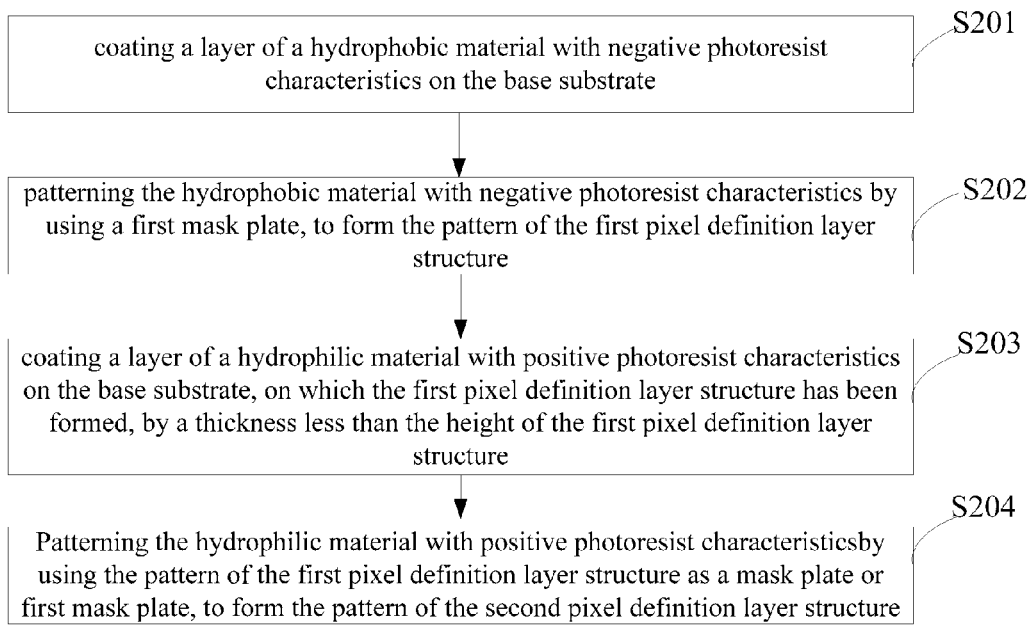
FIG. 4 is a flowchart view showing a manufacturing method for the organic electroluminescent display panel, provided by a first embodiment of the present invention.
Figure 6A:
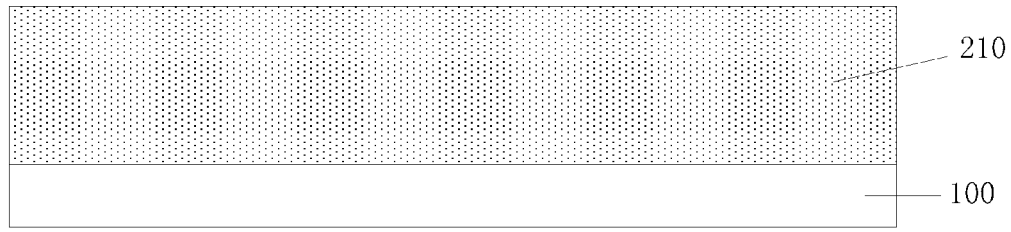
FIG. 6a to FIG. 6d are schematic views showing the structure of the organic electroluminescent display panel after each of steps of its manufacturing method according to the first embodiment of the present invention is performed, respectively.
Figure 6B:
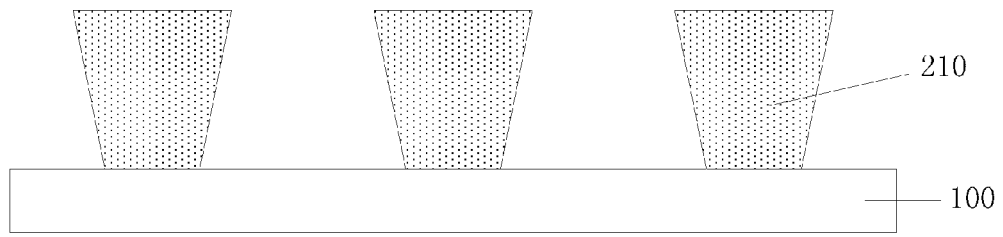

As shown in FIG. 4, the steps for manufacturing the organic electroluminescent display panel will be described as follows, as illustrated by step S201 to step S204:

S201, coating a layer of a hydrophobic material with negative photoresist characteristics on the base substrate 100, as shown in FIG. 6a;

S202, patterning the hydrophobic material with negative photoresist characteristics by means of exposure, development, and etching by using a first mask plate, to form the pattern of the first pixel definition layer structure 210. In this process, because the hydrophobic material has negative photoresist characteristics, it is insoluble in a development liquid after being exposed, while the unexposed material is soluble in the development liquid, thus the pattern of the first pixel definition layer structure can be formed. Also because as the thickness of the negative photoresist is increased, the closer the photoresist material approaches the base substrate, the less the light intensity the photoresist material can receive, the thus-formed pattern of the first pixel definition layer structure 210 can have its cross-section perpendicular to the base substrate to be an inverted trapezoidal structure, as shown in FIG. 6b.

Figure 6C:
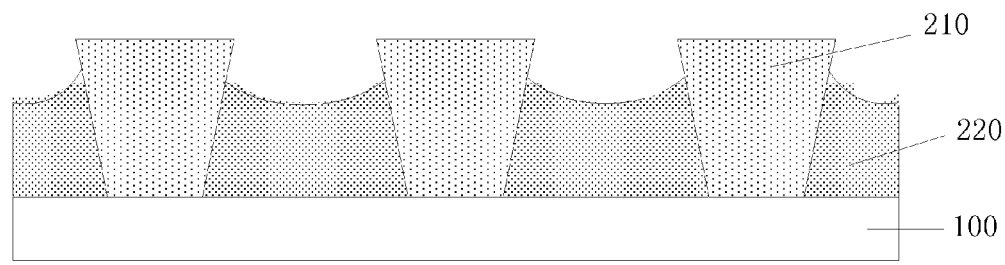

S203, coating a layer of a hydrophilic material with positive photoresist characteristics on the base substrate 100, on which the first pixel definition layer structure 210 has been formed, by a thickness less than the height of the first pixel definition layer structure 210, that is, the hydrophilic material with positive photoresist characteristics is only coated in the opening regions of the pixel definition layer, as shown in FIG. 6c.

Figure 6D:
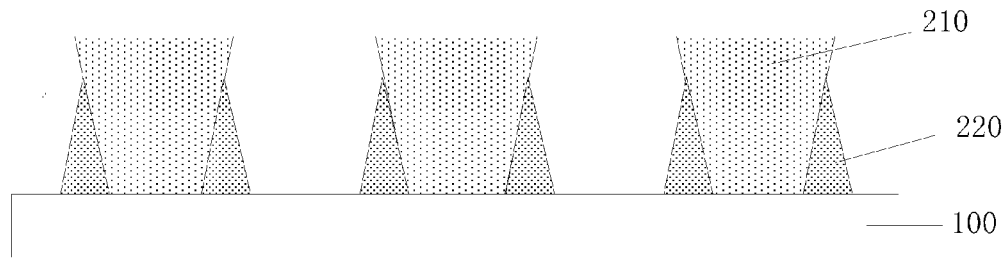

S204, because the cross-section of the first pixel definition layer perpendicular to the base substrate is in an inverted trapezoidal structure with its opening larger than its bottom side, by using the pattern of the first pixel definition layer structure 210 as a mask plate, patterning the hydrophilic material with positive photoresist characteristics by means of exposure, development and etching, to form the pattern of the second pixel definition layer structure 220. Since the second pixel definition layer structure 220 is formed from the hydrophilic material with positive photoresist characteristics, at this time, the second pixel definition layer structure 220 has its cross-section perpendicular to the base substrate to be a triangular structure, as shown in FIG. 6d.

Up to now, by the above steps S201 to S204 provided in the first embodiment, the pixel definition layer of the above organic electroluminescent display panel provided by the embodiment of the present invention can be made.

SECOND EXAMPLE

Figure 5:
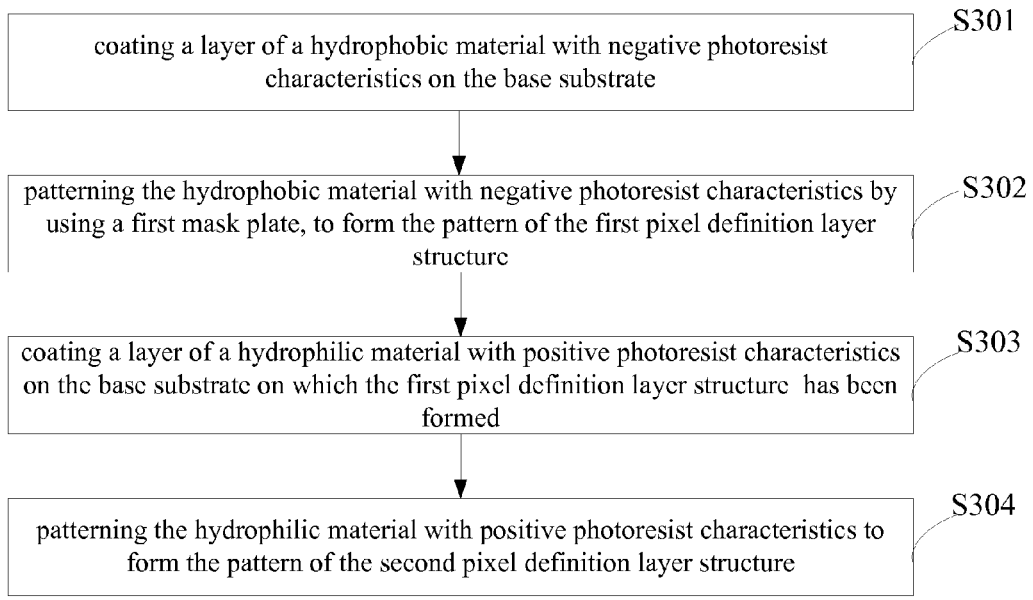
FIG. 5 is a flowchart view showing a manufacturing method for the organic electroluminescent display panel, provided by a second embodiment of the present invention.

As shown in FIG. 5, the steps for manufacturing the pixel definition layer of the organic electroluminescent display panel will be described in detail below, as illustrated by steps S301 to S304.

The steps S301 and S302 are totally identical with the steps S201 and S202 in the first embodiment, thus will not be further described here.

Figure 7A:
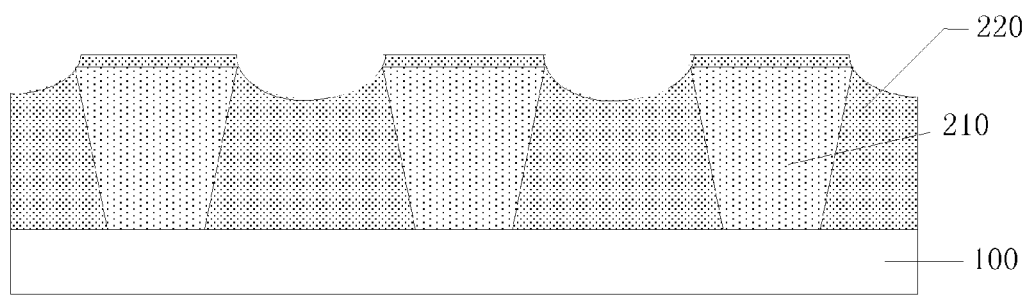
FIG. 7a to FIG. 7b are schematic views showing the structure of the organic electroluminescent display panel after each of steps of its manufacturing method according to the second embodiment of the present invention is performed, respectively.

S303, coating a layer of a hydrophilic material with positive photoresist characteristics on the base substrate 100 on which the first pixel definition layer structure 210 has been formed. In this process, the hydrophilic material fully covers the first pixel definition layer structure 210, that is, the upper surface of the first pixel definition layer structure 210 is also covered by the hydrophilic material, as shown in FIG. 7a.

Figure 7B:
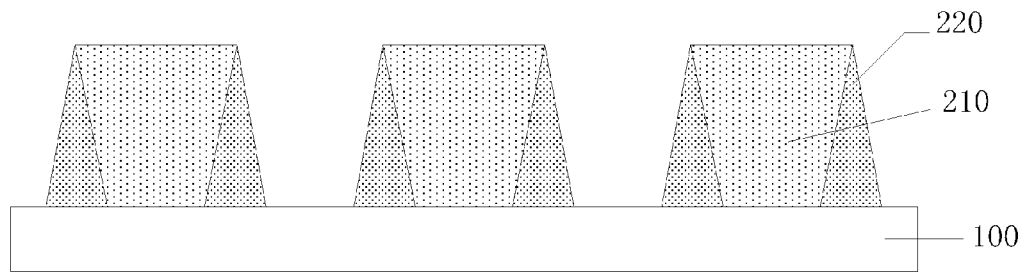

S304, patterning the hydrophilic material with positive photoresist characteristics by means of exposure, development, and etching, to form the pattern of the second pixel definition layer structure 220. Upon etching, the hydrophilic material covering the upper surface of the first pixel definition layer structure 210 is etched off to expose the upper surface of the first pixel definition layer structure, and a portion of the hydrophilic material between the first pixel definition layer structures 210 is also etched off, as shown in FIG. 7b.

Up to now, by the above steps S301 to S304 provided in the second embodiment, the pixel definition layer of the above organic electroluminescent display panel provided by the embodiment of the present invention can be made.

In practice, the manufacturing method for the organic electroluminescent display panel provided by the embodiments of the present invention may further include forming film layer structures, such as a light emitting layer, a cathode, an anode, and so on, on the base substrate, and other structures such as thin film transistors, gate lines, data lines, or the like can also be formed on the base substrate, and these specific structures can be embodied in many ways, and will not be limited here.

Based on the same invention concept, at least one embodiment of the present invention further provides a display device including any one of the above organic electroluminescent display panels as provided by the embodiments of the present invention. The display device can be a mobile phone, a tablet computer, a television, a display, a laptop computer, a digital photo frame, a navigator, and any other product or component having display function. Other component essential to the display device can be conceived by the person skilled in the art, will not be further described and also will not be regarded as limitation on the present invention. The implementation of the display device can be made with reference to the embodiments of the above organic electroluminescent display panel, and the repetition will be omitted here.

With the organic electroluminescent display panel, its manufacturing method and the display device provided by the embodiments of the present invention, the pixel definition layer provided in the organic electroluminescent display panel has opening regions corresponding to the pixel areas of the organic electroluminescent display panel, and each of the opening regions has an opening larger than a bottom surface of the opening region, that is, the cross-section of the pixel definition layer perpendicular to the base substrate is of a regular trapezoidal structure or a structure like a regular trapezoidal, thus the breakage problem occurred in the subsequently formed pattern of the cathode can be avoided.

By forming the upper surface of the pixel definition layer from a hydrophobic material, the subsequently coated light emitting material is not easily left on the upper surface of the pixel definition layer, and thus the color blending problem between the adjacent pixel areas can be avoided. At the same time, the inclination surface of the pixel definition layer corresponding to the opening regions is formed from a hydrophilic material, whereby it can be guaranteed that the subsequently coated light emitting material can be evenly filled in the opening regions, and the minute gaps occurred due to unevenly spreading of the light emitting material would not be caused. Therefore, with the above organic electroluminescent display panel provided by the embodiments of the present invention, the uniformity of the film layers formed after the pixel definition layer can be guaranteed, and the light emitting performance of the organic electroluminescent display panel can be improved.

The present disclosure has been described above by way of the exemplary embodiment, and the protection scope of the present disclosure would not be limited therein, and is only defined by the following claims.

The present application claims the priority of Chinese Patent Application No. 201410389844.X filed on Aug. 8, 2014, the Chinese Patent Application is entirely incorporated therein as a part of the present application by reference.

What is claimed is:

1. An organic electroluminescent display panel, comprising a base substrate and a pixel definition layer located on the base substrate, wherein:
   the pixel definition layer has opening regions corresponding to pixel areas of the organic electroluminescent display panel, and each of the opening regions has an opening larger than a bottom surface of the opening region;
   an upper surface of the pixel definition layer is formed from a hydrophobic material, and an inclination surface of the pixel definition layer corresponding to each of the opening regions is formed from a hydrophilic material.

2. The organic electroluminescent display panel according to claim 1, wherein the pixel definition layer includes a first pixel definition layer structure formed from the hydrophobic material and a second pixel definition layer structure formed from the hydrophilic material, and a side surface of the second pixel definition layer structure is adhered with a side surface of the first pixel definition layer structure.

3. The organic electroluminescent display panel according to claim 2, wherein the first pixel definition layer structure has a cross-section perpendicular to the base substrate in an inverted trapezoidal structure.

4. The organic electroluminescent display panel according to claim 2, wherein the second pixel definition layer structure has a cross-section perpendicular to the base substrate in a triangular structure.

5. The organic electroluminescent display panel according to claim 2, wherein a height of the second pixel definition layer structure in its cross-section perpendicular to the base substrate is lower than a height of the first pixel definition layer structure in its cross-section perpendicular to the base substrate.

6. The organic electroluminescent display panel according to claim 2, wherein a material for the first pixel definition layer structure is a hydrophobic material with negative photoresist characteristics.

7. The organic electroluminescent display panel according to claim 2, wherein a material for the second pixel definition layer structure is a hydrophilic material with positive photoresist characteristics.

8. A manufacturing method for the organic electroluminescent display panel according to claim 1, including steps of:
   forming the pixel definition layer on the base substrate, wherein the pixel definition layer has opening regions corresponding to pixel areas of the organic electroluminescent display panel, and each of the opening regions has an opening larger than a bottom surface of the opening region; and an upper surface of the pixel definition layer is formed from a hydrophobic material, and an inclination surface of the pixel definition layer corresponding to each of the opening regions is formed from a hydrophilic material.

9. The manufacturing method according to claim 8, wherein forming of the pixel definition layer on the base substrate includes:
   forming a pattern of a first pixel definition layer structure on the base substrate; and
   forming a pattern of a second pixel definition layer structure on the base substrate on which the first pixel definition layer structure has been formed.

10. The manufacturing method according to claim 9, wherein:
    a layer of the hydrophobic material with negative photoresist characteristics is deposited on the base substrate;
    the hydrophobic material with negative photoresist characteristics is subjected to a patterning process by a first mask plate to form the pattern of the first pixel definition layer structure.

11. The manufacturing method according to claim 9, wherein:
    a layer of the hydrophilic material with positive photoresist characteristics is deposited on the base substrate on which the first pixel definition layer structure has been formed;
    the hydrophilic material with positive photoresist characteristics is subjected to a patterning process by using the pattern of the first pixel definition layer structure as a mask plate or by using the mask plate used in forming the first pixel definition layer structure, to form the pattern of the second pixel definition layer structure.

12. The manufacturing method according to claim 11, wherein upon depositing the hydrophilic material, a thickness by which the hydrophilic material is coated is less than a height of the first pixel definition layer structure.

13. The manufacturing method according to claim 11, wherein, in depositing the hydrophilic material, the hydrophilic material is caused to fully cover the first pixel definition layer structure, and in forming the pattern of the second pixel definition layer structure, the hydrophilic material covering the top of the first pixel definition layer structure is etched off to expose the upper surface of the first pixel definition layer structure.

14. A display device comprising the organic electroluminescent display panel according to claim 1.

15. The organic electroluminescent display panel according to claim 3, wherein the second pixel definition layer structure has a cross-section perpendicular to the base substrate in a triangular structure.

16. The organic electroluminescent display panel according to claim 3, wherein a height of the second pixel definition layer structure in its cross-section perpendicular to the base substrate is lower than a height of the first pixel definition layer structure in its cross-section perpendicular to the base substrate.

17. The organic electroluminescent display panel according to claim 3, wherein a material for the first pixel definition layer structure is a hydrophobic material with negative photoresist characteristics.

18. The organic electroluminescent display panel according to claim 3, wherein a material for the second pixel definition layer structure is a hydrophilic material with positive photoresist characteristics.

19. The organic electroluminescent display panel according to claim 4, wherein a height of the second pixel definition layer structure in its cross-section perpendicular to the base substrate is lower than a height of the first pixel definition layer structure in its cross-section perpendicular to the base substrate.

20. The manufacturing method according to claim 10, wherein:
   a layer of the hydrophilic material with positive photoresist characteristics is deposited on the base substrate on which the first pixel definition layer structure has been formed;
   the hydrophilic material with positive photoresist characteristics is subjected to a patterning process by using the pattern of the first pixel definition layer structure as a mask plate or by using the mask plate used in forming the first pixel definition layer structure, to form the pattern of the second pixel definition layer structure.

\* \* \* \* \*